US011954412B1

(12) United States Patent
Thunes et al.

(10) Patent No.: US 11,954,412 B1
(45) Date of Patent: Apr. 9, 2024

(54) DATA TRANSFER BETWEEN A TWO-DIMENSIONAL SPACE AND A THREE-DIMENSIONAL SPACE FOR MULTIPHYSICS SIMULATIONS

(71) Applicant: Ansys, Inc., Canonsburg, PA (US)

(72) Inventors: James Thunes, Kitchener (CA); Steve Reuss, Kitchener (CA)

(73) Assignee: Ansys, Inc., Canonsburg, PA (US)

( * ) Notice: Subject to any disclaimer, the term of this patent is extended or adjusted under 35 U.S.C. 154(b) by 777 days.

(21) Appl. No.: 17/035,961

(22) Filed: Sep. 29, 2020

Related U.S. Application Data

(60) Provisional application No. 63/012,711, filed on Apr. 20, 2020.

(51) Int. Cl.
*G06F 30/20* (2020.01)

(52) U.S. Cl.
CPC .................. *G06F 30/20* (2020.01)

(58) Field of Classification Search
CPC ...................................... G06F 30/20
See application file for complete search history.

(56) References Cited

U.S. PATENT DOCUMENTS

| 7,050,951 | B1 * | 5/2006 | Tautges | G06T 17/10 |
| | | | | 703/2 |
| 2009/0231334 | A1 * | 9/2009 | Chen | G06T 17/205 |
| | | | | 345/420 |

OTHER PUBLICATIONS

H. Nasser, S. Greedy, T. Benson, A. Vukovic and P. Sewell, "3D to 2D surface mesh parameterization for unstructured transmission line method simulations," 2015 IEEE International Conference on Computational Electromagnetics, Hong Kong, China, 2015, pp. 338-340, doi: 10.1109/COMPEM.2015.7052654. (Year: 2015).*
Eisemann E, Paris S, Durand F. A visibility algorithm for converting 3D meshes into editable 2D vector graphics. InACM SIGGRAPH 2009 papers Jul. 27, 2009 (pp. 1-8). (Year: 2009).*
E. Rank, M. Ruess, S. Kollmannsberger, D. Schillinger, A. Duster, Geometric modeling, isogeometric analysis and the finite cell method,Computer Methods in Applied Mechanics and Engineering, vols. 249-252, 2012,pp. 104-115,ISSN 0045-7825,https://doi.org/10.1016/j.cma.2012.05.022. (Year: 2012).*

(Continued)

*Primary Examiner* — Eunhee Kim
(74) *Attorney, Agent, or Firm* — Jones Day

(57) ABSTRACT

Techniques are provided for the transfer of data (e.g. electromagnetic losses and temperature for an electro-thermal simulation) between domains (e.g. 2D regions, 3D regions) with dissimilar topologies, e.g. to represent a physical object. Meshes from 2D and 3D regions of respective simulation models involved in the data transfer are projected onto and through one another. For profile preserving (e.g., temperature, convection coefficients, mesh displacements, etc.) and conservative (e.g., force, mass, or thermal energy, etc.) data transfers, shape functions and area/volume fractions are used in mapping weight generation, respectively. These weights are later used to generate field values on the mesh of the target simulation model, using data from the mesh of the source simulation model. Related apparatus, systems, techniques and articles are also described.

20 Claims, 18 Drawing Sheets

(56) References Cited

OTHER PUBLICATIONS

Aigner et al.. "Swept volume parameterization for isogeometric analysis." In Mathematics of Surfaces XIII: 13th IMA International Conference York, UK, Sep. 7-9, 2009 Proceedings 13, pp. 19-44. Springer Berlin Heidelberg, 2009. (Year: 2009).*

Li Y, Ni J. Constraints based nonrigid registration for 2D blade profile reconstruction in reverse engineering. Journal of computing and information science in engineering. Sep. 1, 2009;9(3). (Year: 2009).*

* cited by examiner

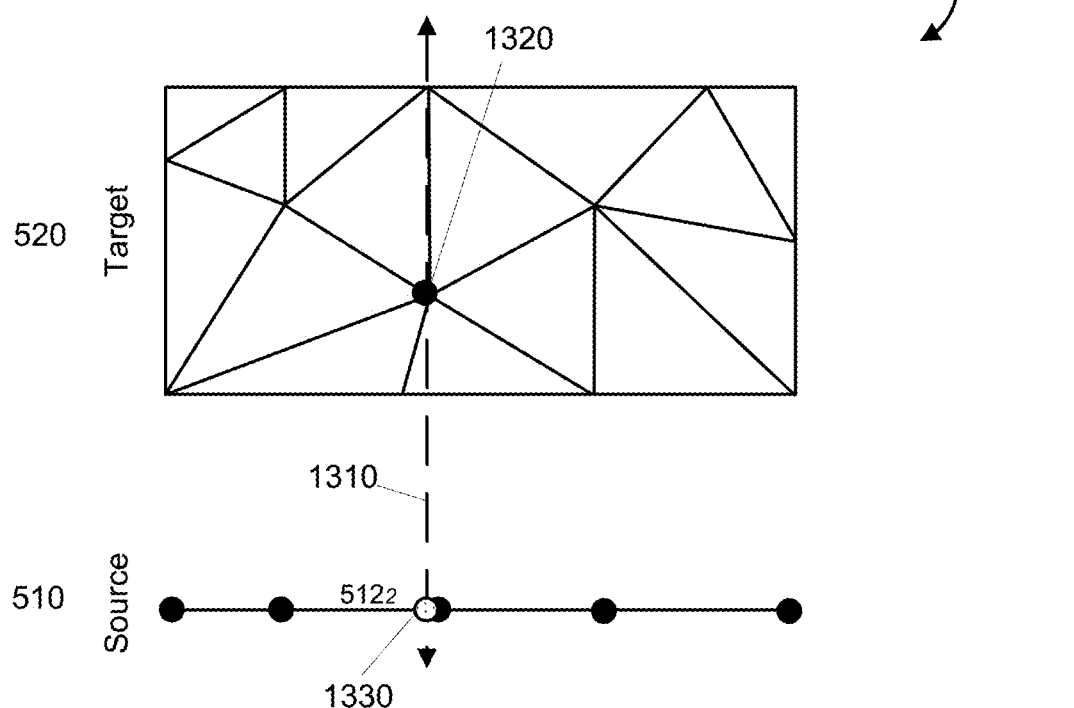
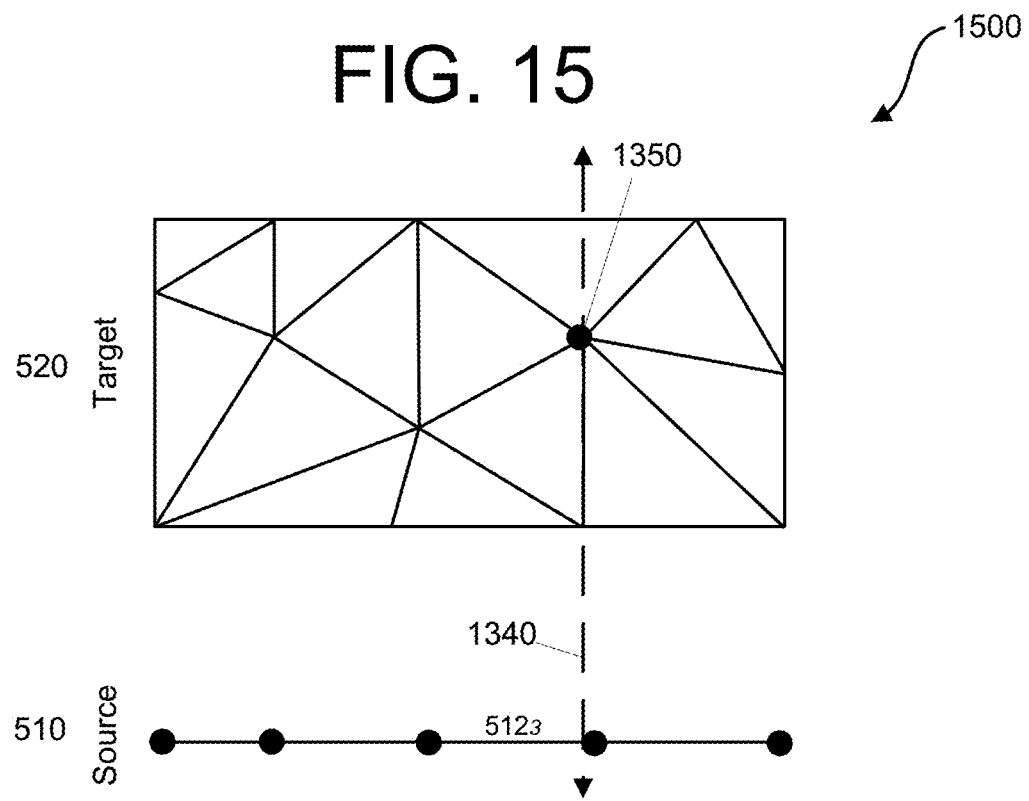

DATA TRANSFER BETWEEN A TWO-DIMENSIONAL SPACE AND A THREE-DIMENSIONAL SPACE FOR MULTIPHYSICS SIMULATIONS

RELATED APPLICATION

The current application claims priority to U.S. Pat. App. Ser. No. 63/012,711 filed on Apr. 20, 2020, the contents of which are hereby fully incorporated by reference.

TECHNICAL FIELD

The subject matter described herein relates to transfer of conservative and profile preserving data between a two dimensional (2D) space and a three dimensional (3D) space for applications such as multiphysics simulations.

BACKGROUND

Computer-based, multiphysics simulations utilize multiple models for characterizing physical systems. These models may, in some instances, have varying topologies (i.e., dimensionality). Multiphysics simulations require transferring data between models, and techniques for transferring data between dissimilar topologies requires different approaches depending on the type of data (e.g., conservative: mass, momentum, energy; profile preserving: temperature, displacement, etc.) being transferred and the direction of the transfer.

SUMMARY

Data is transferred between simulation models having different topological dimensionality in which data is received that characterizes a first simulation model for a physical object in two dimensions (2D) and a second simulation model for the physical object in three dimensions (3D). The first simulation model includes a 2D mesh having a plurality of 2D elements and the second simulation model includes a 3D mesh having a plurality of 3D elements. With this arrangement, one of the first simulation model and the second simulation model is a source simulation model and the other simulation model is a target simulation model. In some variations, the transferred data relates to force, mass and/or thermal energy or other variables that can be transferred in a conservative manner (the "conservative approach"). In other variations, the transferred data relates to temperature, convection coefficients, and/or mesh displacements or other variables that can be transferred in a profile preserving manner (the "profile preserving approach").

With the conservative approach, a plurality of pseudoelements are generated in 3D based on a sweep direction of the 2D mesh. Intersections between the pseudoelements and the 3D mesh are then determined. Based on these determined intersections, one or more weights are then generated. Values of physical characteristics for the target simulation model are generated by mapping values of physical characteristics stored on or associated with mesh nodes, or centroids or integration points of the mesh elements or the faces or edges thereof of the source simulation model to the mesh of the target simulation model using these weights. The one or more weights can form part of a set of weights represented, for example, as a matrix or other application format.

With the conservative approach, the pseudoelements can be swept from the 2D elements. A pseudoelement in this context can be characterized as a supplemental mesh element, which is not part of the source or target meshes but is used in evaluating the spatial coincidence of those meshes.

With the conservative approach and when the 2D simulation model is the source simulation model, contributions from a corresponding 2D element to each 3D element can be calculated for each pseudoelement based on a percentage of total intersected volume the pseudoelement intersects the 3D element. With such arrangements, the matrix of weights between the source simulation model and the target simulation model is generated based on the calculating.

With the conservative approach and when the 3D simulation model is the source simulation model, a contribution from each 3D element in the intersection is calculated for each pseudoelement based on a percentage that each such 3D element intersects the pseudoelement. With such arrangements, the matrix of weights between the source simulation model and the target simulation model is generated based on the calculating.

With the profile preserving approach, a plurality of sweep paths from the target simulation model are projected in a sweep direction. Intersections between the sweep paths and the mesh of the source simulation model are then determined. Based on these intersections, one or more weights (e.g., a matrix of weights) are generated. The one or more weights can form part of a set of weights represented, for example, as a matrix or other applicable format. Values of characteristics for the target simulation model are generated by mapping values from the mesh of the source simulation model to the mesh of the target simulation model using the one or more weights.

With the profile preserving approach, the target simulation model can include a plurality of mesh objects from which the sweep paths are projected from. The mesh objects can include, for example, nodes, elements centroids, or quadrature points.

With the profile preserving approach, the sweep path can take various forms including a curve.

With the profile preserving approach and when the source simulation model is the first simulation model (i.e., a 2D simulation model), a contribution from each 2D mesh element can be calculated, using a shape function which interpolates a value between the discrete values at the mesh elements, based on a value at the intersection of the sweep path and the 2D mesh element. This calculation can be used to generate the matrix of weights between the source simulation model and the target simulation model.

With the profile preserving approach and when the source simulation model is a the second simulation model (i.e., a 3D simulation model), a contribution from each 3D element in the intersection between the sweep path and the 3D mesh elements can be calculated based on a percentage of each such 3D element with respect to the intersection. This calculation can be used to generate the matrix of weights between the source simulation.

With either approach, the sweep direction can be a normal direction, a rotational direction, a path which includes scaling of the 2D mesh, and/or an arbitrary path.

With either approach, the values of characteristics for the target simulation model can be displayed in an electronic visual display, persisted in physical storage, loaded into memory, and/or transmitted to a remote computing system.

Non-transitory computer program products (i.e., physically embodied computer program products, non-transitory computer readable media, etc.) are also described that store instructions, which when executed by one or more data processors of one or more computing systems, cause at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, the current subject matter provides techniques for more precise data transfer between data models having differing dimensions while, at the same time, utilizing fewer computing resources (e.g., CPU, GPU, memory, etc.).

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

FIGS. 13-15 are diagrams illustrating aspects of the process of FIG. 11 relating to the transfer of profile preserving data from a 2D space to a 3D space;

Like reference symbols in the various drawings indicate like elements.

DETAILED DESCRIPTION

The current subject matter is directed to the transfer of data (e.g. electromagnetic losses and temperature for an electro-thermal simulation) between models (e.g. 2D simulation model, 3D simulation models) with dissimilar topologies that represent a physical object. The current subject matter can be applied to perform multiphysics simulations (e.g. simulation consisting of two or more different physics) which can require a 3D analysis for one physics in the analysis while other aspects of the analysis can utilize a 2D analysis for another physics in the same simulation. The current subject matter can allow coupling between physics solvers with dissimilar topological dimensionality (3D and 2D).

In one example described in further detail below, meshes from 2D and 3D regions involved in data transfer are projected onto and through one another. For profile preserving (e.g. temperature, convection coefficients, mesh displacement, etc.) and conservative (e.g. mass, momentum, energy) data transfers, shape functions and area/volume fractions are used in mapping weight generation, respectively. These weights are later used to generate field values on the data transfer's target mesh, using data on the transfer's source mesh.

Figure 1:
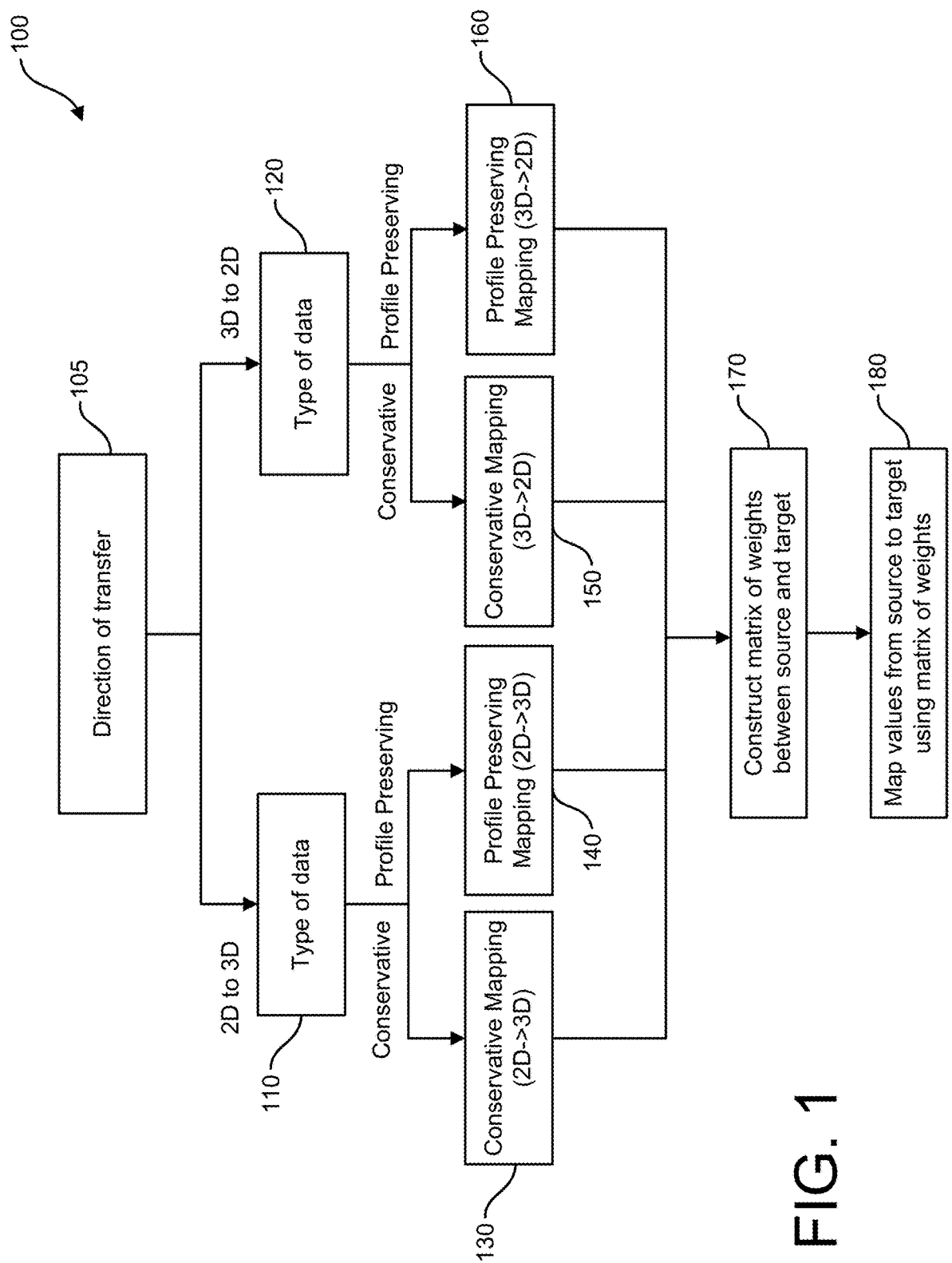
FIG. 1 is a process flow diagram illustrating data transfer between data models of different dimensionality.

Diagram 100 of FIG. 1 provides an overview of the processes described in further detail regarding the transfer of data from a 2D space and a 3D space and vice versa. Initially, at 105, the direction of transfer is determined (e.g., 2D to 3D or 3D to 2D). Depending on the direction, the corresponding type of data 110, 120 needs to be determined which later affects how such data is transferred. For example, one type of data can be conservative (i.e., data for which the quantity should be conserved, e.g., thermal energy, etc.) which requires a specialized mapping technique 130, 150 for both the 2D to 3D direction of data transfer and for the 3D to 2D direction of data transfer. In addition, another type of data can be profile preserving data (i.e., data for which the profile from the source, but not necessarily the total quantity should be preserved such as temperature distribution data, etc.) which requires a specialized mapping technique 140, 160 for both the 2D to 3D direction of data transfer and for the 3D to 2D direction of data transfer. The ultimate output of these mapping techniques 130-160 can be to construct a matrix of weights 170 between the source data space and the target data space. The matrix of weights 170 is an example format in which one or more weights can be represented and is used herein for illustrative purposes. This matrix of weights can then be used, at 180, to map values from the source data space to the target data space. These values can, for example, correspond to values of physical characteristics stored on or associated with mesh nodes, or centroids or integration points of the mesh elements or the faces or edges thereof.

Figure 2:
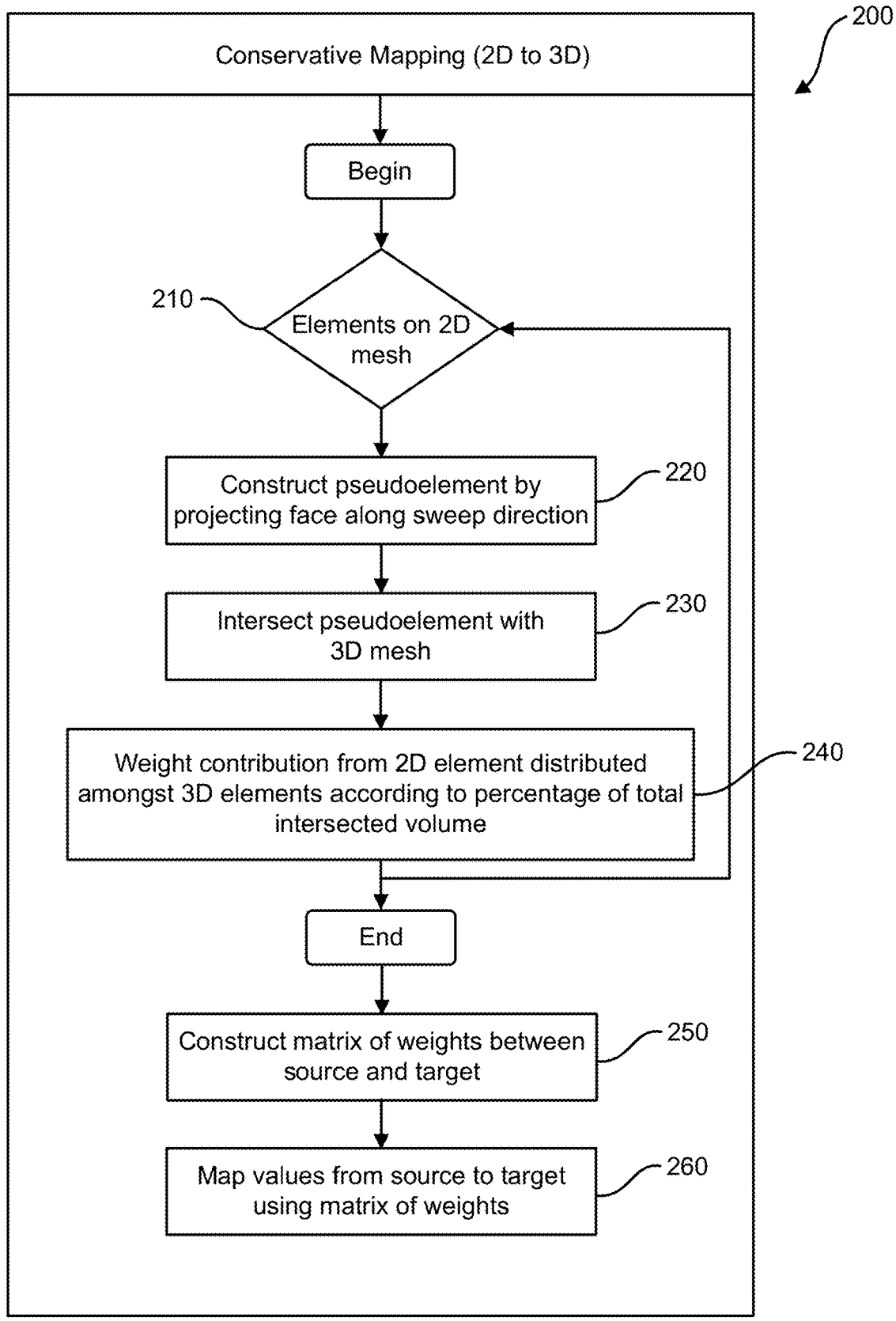
FIG. 2 is a process flow diagram illustrating the transfer of conservative data from a 2D space to a 3D space.

FIG. 2 is a process flow diagram 200 showing further details regarding the scenario for the transfer of conservative data from a 2D space (having a corresponding 2D mesh) to a 3D space (having a corresponding 3D mesh). The process begins, at 210, by identifying elements on the 2D mesh. An iterative process then begins in which a pseudoelement is constructed, at 220, by projecting a face from an element of the 2D mesh along a sweep direction and, at 230, an intersection of the pseudoelement with the 3D mesh is determined. Based on this intersection, at 240, the contribution from the 2D element is weighted based on the 3D elements intersecting the pseudoelement according to their corresponding percentage of total intersected volume. The process can continue until all 2D elements are characterized. The output can be used, at 250, to construct a matrix of weights between the source (i.e., 2D mesh) and the target (i.e., 3D mesh). Thereafter, at 260, the matrix of weights can then be used to map values from the source data space (e.g., values of physical characteristics associated with mesh nodes, or centroids or integration points of the mesh elements or the faces or edges thereof) to the target data space. A pseudoelement as provided herein can be characterized as a supplemental mesh element, which is not part of the source or target meshes but is used in evaluating the spatial coincidence of those meshes.

Figure 3:
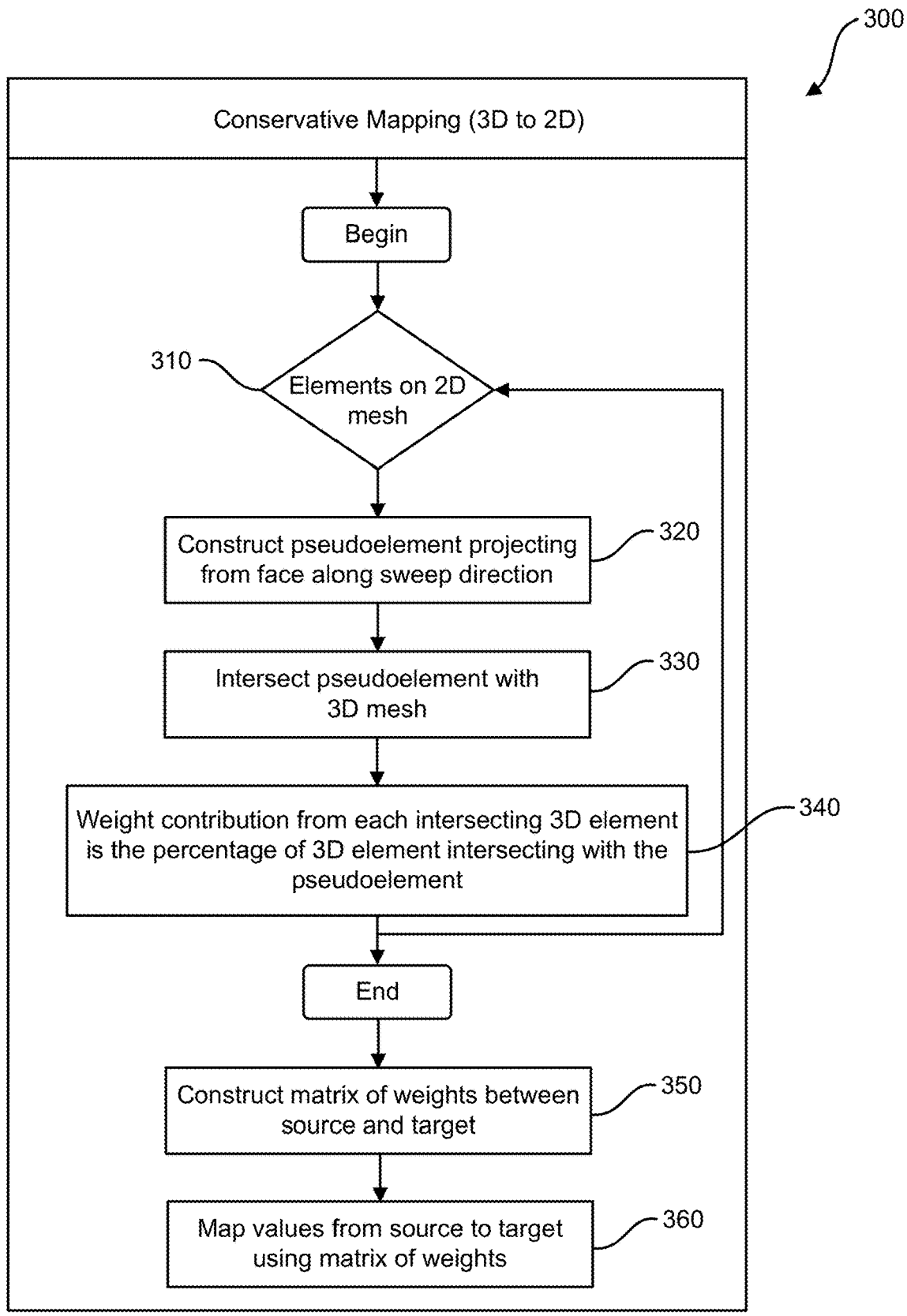
FIG. 3 is a process flow diagram illustrating the transfer of conservative data from a 3D space to a 2D space.

FIG. 3 is a process flow diagram 300 showing further details regarding the transfer of conservative data from a 3D space (having a corresponding 3D mesh) to a 2D space (having a corresponding 2D mesh). The process begins, at 310, by identifying elements on the 2D mesh. An iterative process then begins in which a pseudoelement is constructed, at 320, that projects from a face of the 2D mesh in the sweep direction. Next, at 330, an intersection of the pseudoelement with the 3D mesh is determined. Based on this intersection, at 340, the contribution from each intersecting 3D element is determined based on a weighted contribution of the percentage of such 3D elements intersecting the pseudoelement. The process can continue until all 3D elements are characterized. The output can be used, at 350, to construct a matrix of weights between the source (i.e., 3D mesh) and the target (i.e., 2D mesh). This matrix of weights can then be used, at 360, to map values from the source data space (e.g., values of physical characteristics associated with mesh nodes, or centroids or integration points of the mesh elements or the faces or edges thereof) to the target data space.

Figure 4:
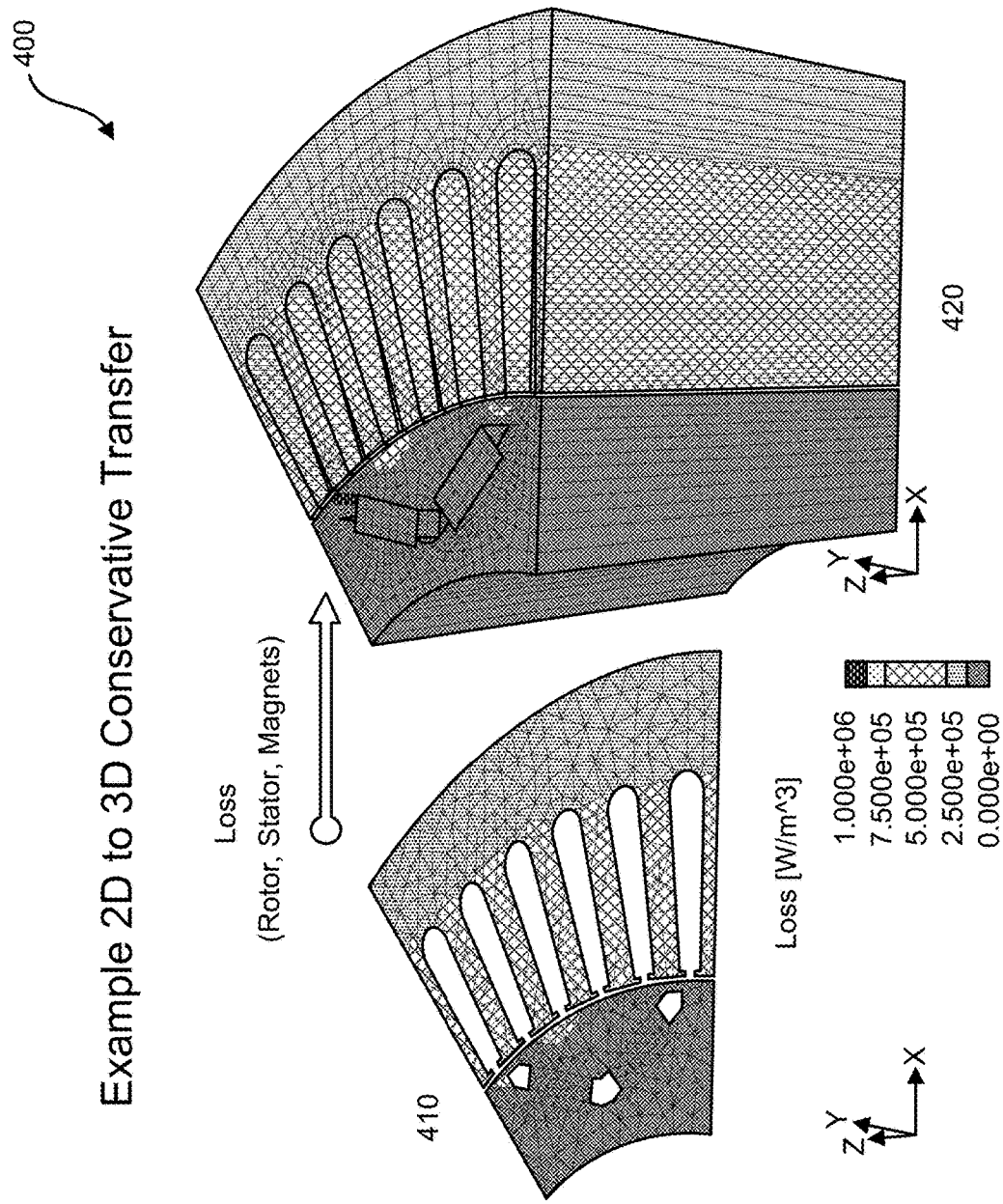
FIG. 4 is a diagram illustrating an example visualization generated from the transfer of conservative data from a 2D space to a 3D space as in FIG. 2.

FIG. 4 is a diagram 400 illustrating a visualization of the transfer of conservative data from a 2D space 410 to a 3D space 420 using the process of FIG. 2 as an input to a solver. In particular, an electromagnetics physics solver in 2D space 410 calculates loss, which is conservatively transferred to the 3D space 420, to drive the thermal physics solver in that 3D space.

Figure 5:
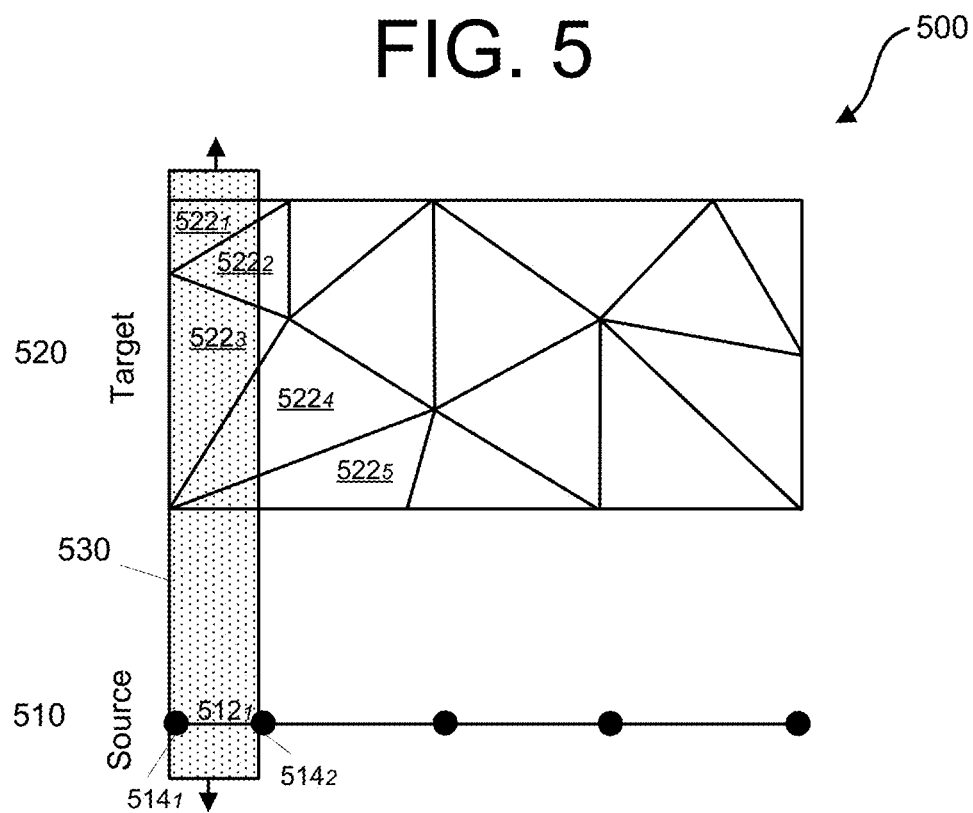
FIGS. 5-7 are diagrams illustrating aspects of the process of FIG. 2 relating to the transfer of conservative data from a 2D space to a 3D space.
Figure 6:
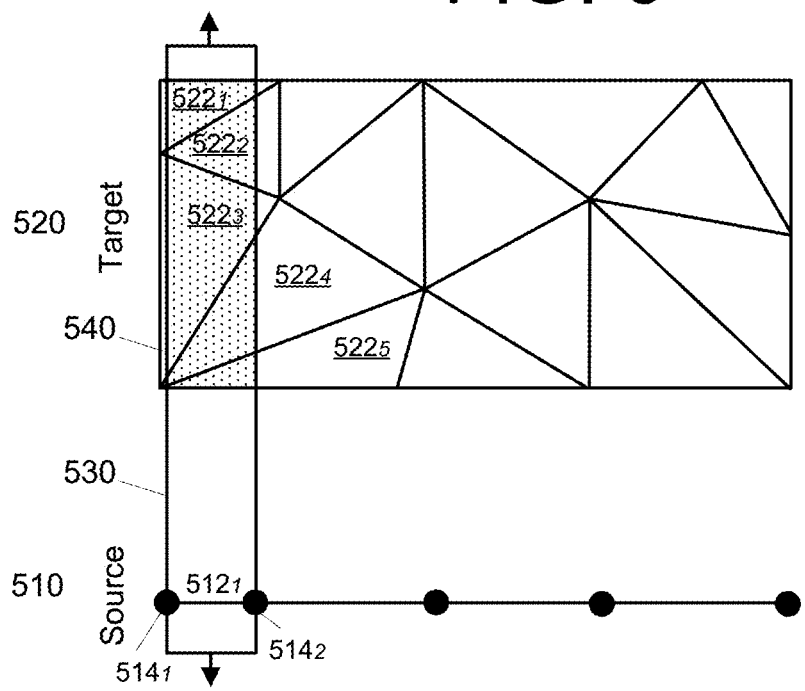
Figure 7:
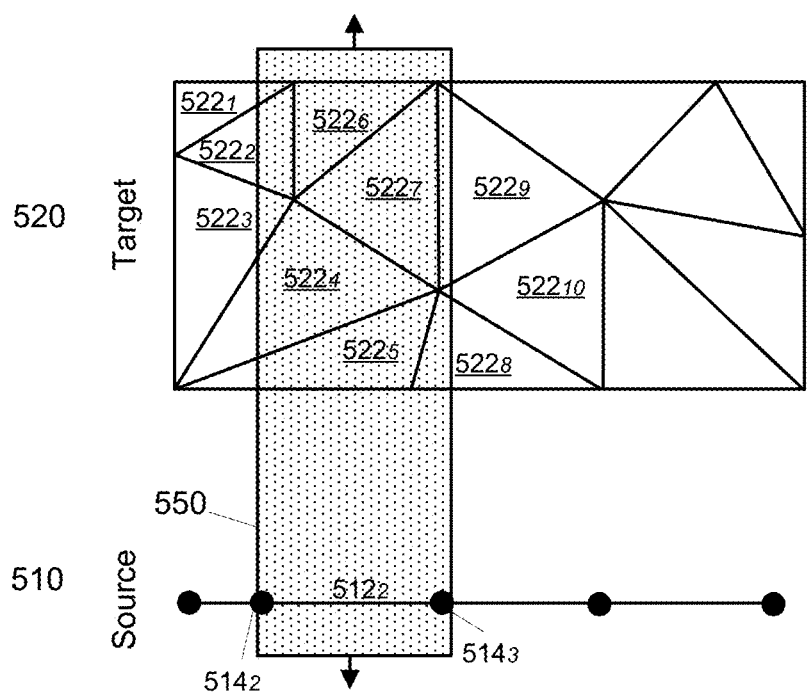

FIGS. 5-7 are diagrams 500-700 illustrating aspects of the process of FIG. 2 relating to the transfer of conservative data from a 2D space to a 3D space. Initially, with reference to FIG. 5, the source comprises a series of 2D elements $512_{1...n}$ (e.g., triangles) which together form the 2D mesh 510. The 2D mesh 510 can additionally comprise a series of 2D nodes $514_{1...n}$. In addition, the target comprises a series of 3D elements $522_{1...n}$ (e.g., tetrahedra) which together form the 3D mesh 520. A pseudoelement 530 is constructed which extends from a first 2D element $512_1$ along a sweep direction relative to the 2D mesh 510. As is illustrated, the pseudoelement 530 extends and intersects five 3D elements $522_{1...5}$ forming part of the 3D mesh 520. With reference to FIG. 6, an intersection 540 between the 3D mesh 520 and the pseudoelement 530 is determined (i.e., a sum or aggregate of all intersected 3D elements $522_{1...5}$). FIG. 7 illustrates the advancement of the iterative process of FIG. 2 with the construction of a new pseudoelement 550 at a next subsequent 2D element $512_2$ which intersects 3D elements $522_{1...10}$.

With the examples illustrated in FIGS. 5-7, the contributions from the 2D element (e.g., element $512_1$) to each 3D element (e.g., elements $522_{1...5}$) can be weighted according to the percentage of the total intersected volume as provided below:

$$\phi_{t_j} = \sum_{i=1}^{n} \phi_{s_i} \frac{v_{t_j} \cap s_i}{V_t \cap v_{s_i}}$$

where $\phi_{tj}$ is the target data on the jth target element, $522_j$, $\phi_{si}$ the source data on the ith source element $512_i$, $v_{tj} \cap_{si}$ is the intersection between the pseudoelement (e.g. 530) for the ith source element $512i$ and the jth target element $522_j$, and $V_t \cap v_{si}$ is the intersected volume between the target domain 520 and the pseudoelement (e.g. 530) for the ith source element $512i$. For example, a pseudoelement 530 is projected from the source element $512_1$ and intersects with the target elements $522_1, 522_2, 522_3, 522_4, 522_5$. The contribution from the source element to each target element is weighted by the intersection of the target element with the pseudoelement. This weight can be calculated as, for example, the intersected volume of the target element $522_1$ divided by the total intersected volume of the pseudoelement and the target domain 520. Multiplying this weight by the value of the source element $512_1$ provides the contribution of $512_1$ to the total value on the target element $522_1$. The total value on the target element, $522_1$, is the sum of each such contribution from each respective source element, such as element $512_1$ to the target element, $522_1$. The contribution of source element $512_1$ may depend on a combination of values associated with source nodes $514_1, 514_2$ of source element $512_1$.

Figure 8:
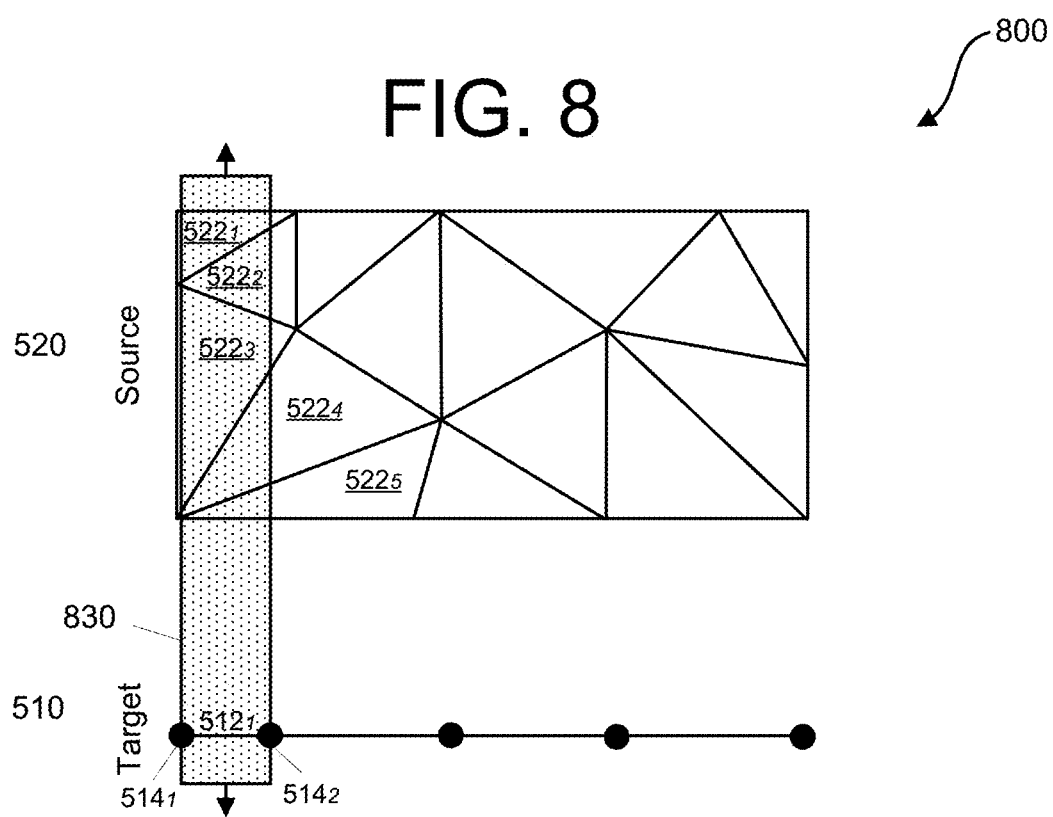
FIGS. 8-10 are diagrams illustrating aspects of the process of FIG. 3 relating to the transfer of conservative data from a 3D space to a 2D space.
Figure 9:
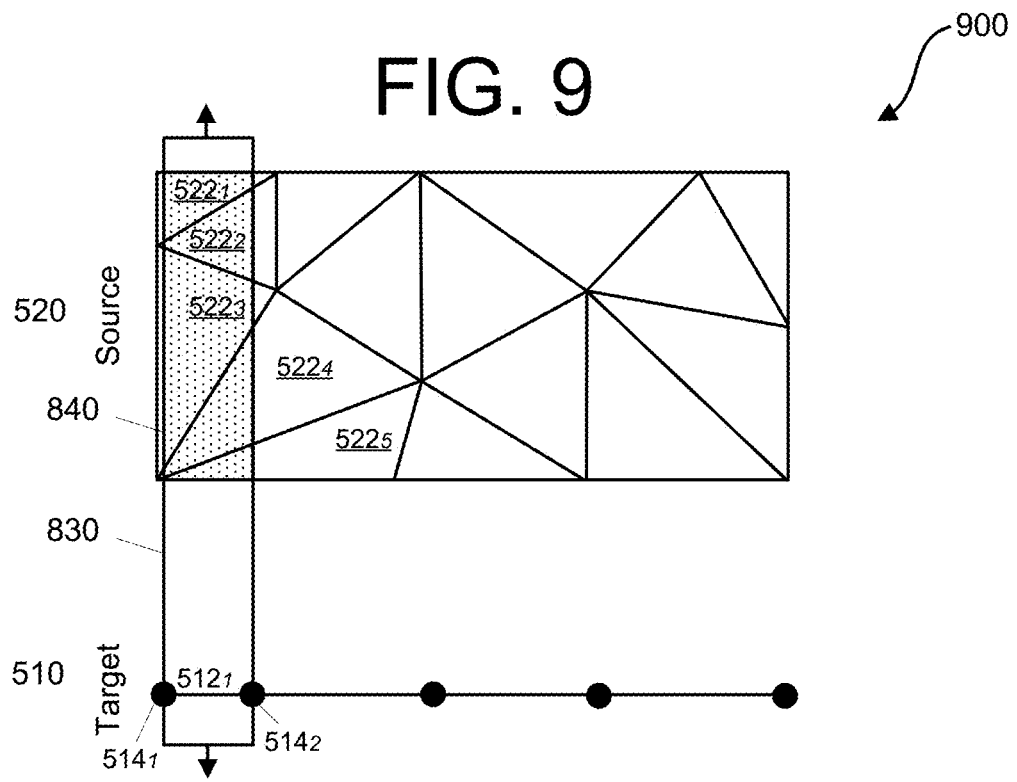
Figure 10:
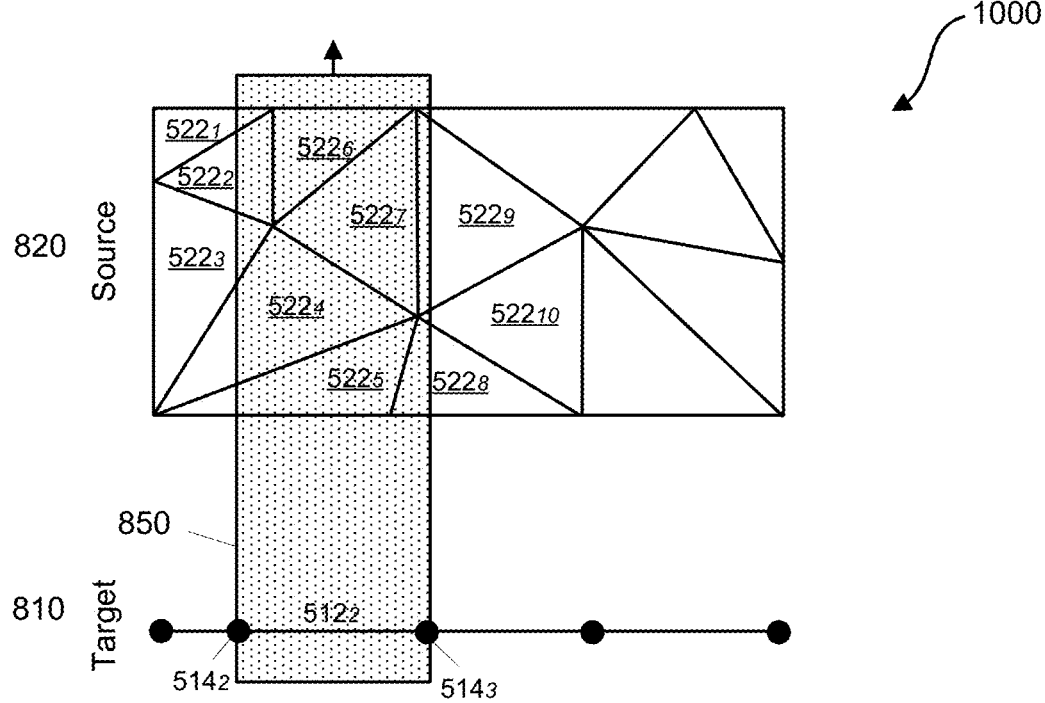

FIGS. 8-10 are diagrams 800-1000 illustrating aspects of the process of FIG. 3 relating to the transfer of conservative data from a 3D space to a 2D space. Initially, with reference to FIG. 8, the target comprises a series of 2D elements $512_{1...n}$ (e.g., triangles) which together form the 2D mesh 510. In addition, the source comprises a series of 3D elements $522_{1...n}$ (e.g., tetrahedra) which together form the 3D mesh 520. A pseudoelement 830 is constructed which is projected from a first 2D element 512/along a sweep direction relative to the 2D mesh 510. As is illustrated, the pseudoelement 830 extends and intersects five 3D elements $522_{1...5}$ forming part of the 3D mesh 520. With reference to FIG. 9, an intersection 840 between the 3D mesh 520 and the pseudoelement 830 is determined. FIG. 10 illustrates the advancement of the iterative process of FIG. 2 with the construction of a new pseudoelement 850 extending from the next subsequent 2D element $512_2$ and intersecting 3D elements $522_{1...10}$.

With the examples illustrated in FIGS. 8-10, the contributions from elements (e.g., elements $522_{1...5}$) to each 2D element (e.g., element $512_1$) can be weighted according to the percentage of the total intersected volume as provided below:

$$\phi_{ti} = f(\phi s, V_s \cap v_{ti})$$

where $\phi_{ti}$ is the target data on the ith element $512_i$, f can represent a linear combination of the source data, $\phi_s$ is the source data on the source domain 520 which is stored on or associated with, for example, the source elements (e.g. $522_1, 522_2, 522_3, 522_6, 522_7$). $V_s \cap v_{ti}$ is the intersected volume between the source domain 520 and the pseudoelement for the ith target element $512_1$. For example, a pseudoelement 830 is projected from target element $512_1$ and intersects with the source elements $522_1$, $522_2$, $522_3$, $522_6$, $522_7$. The value on the target element, $512_1$, can be found, for example, by summing the contribution of each source element ($522_1$ to $522_7$). The weight for each source element (e.g. $522_1$) is the intersected volume between the element and the pseudoelement, 830, divided by the total volume of the source element, $522_1$. With the contribution of each source element then calculated as the value for that element multiplied by the weight, the total value on the target element $512_1$ can then be computed as the sum of the contribution from each such source element.

Figure 11:
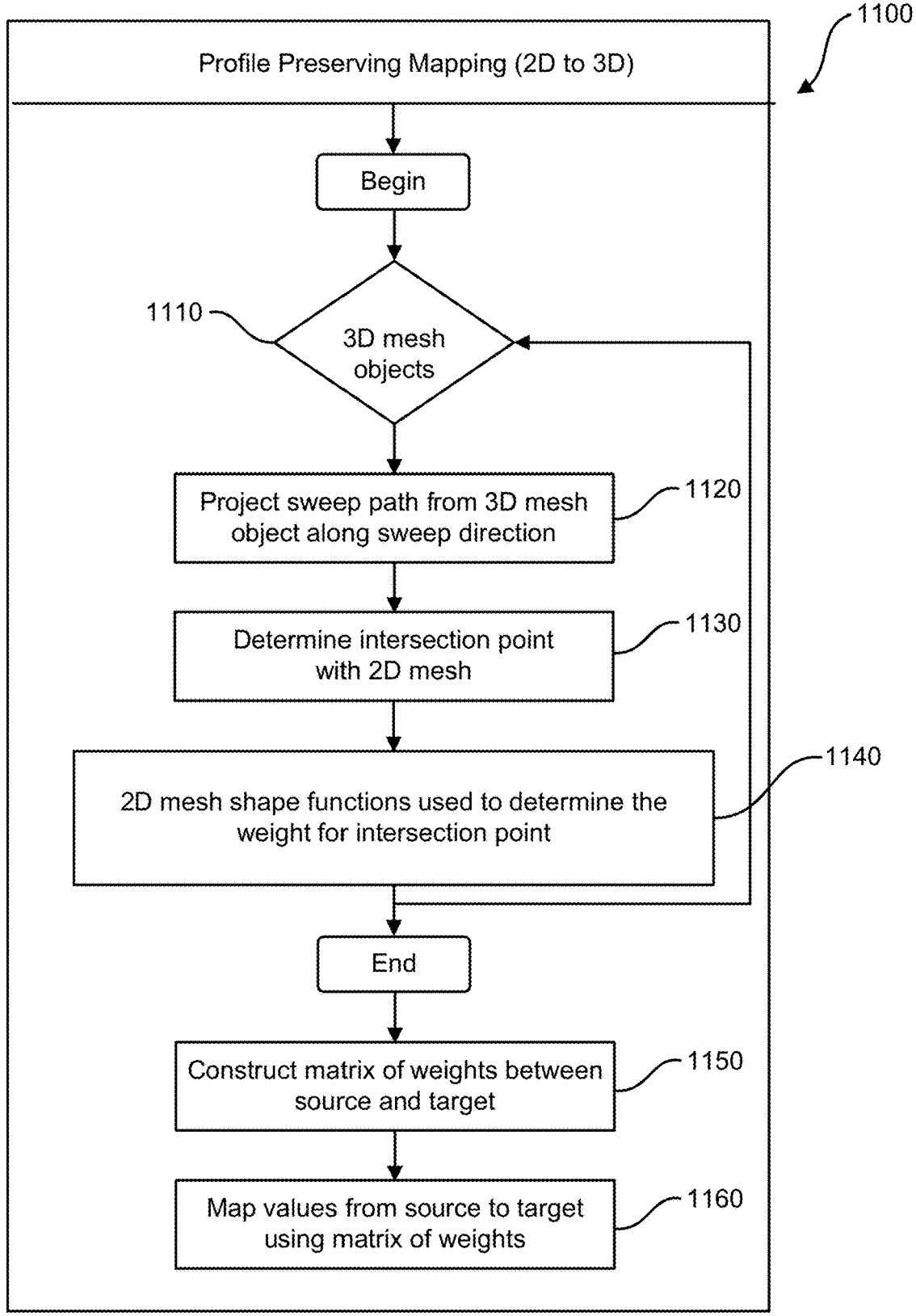
FIG. 11 is a process flow diagram illustrating the transfer of profile preserving data from a 2D space to a 3D space.

FIG. 11 is a process flow diagram 1100 showing further details regarding the scenario for the transfer of profile preserving data from a 2D space (having a corresponding 2D mesh) to a 3D space (having a corresponding 3D mesh). Initially, at 1110, mesh objects (e.g., nodes, elements centroids, quadrature points, etc.) within the 3D mesh are identified. An iterative process then begins, at 1120, in which a sweep path (e.g., a curve, etc.) is projected along a sweep direction from a mesh object in the 3D mesh. Thereafter, at 1130, an intersection point of the sweep path and the 2D mesh is determined. Next, at 1140, 2D mesh shape functions are used to determine the weight for the intersection point, where values of physical characteristics are associated with source mesh nodes, or centroids or integration points of the mesh elements or the faces or edges thereof. The process can continue until all mesh objects of the 3D mesh are characterized. The output can be used, at 1150, to construct a matrix of weights between the source (i.e., 2D mesh) and the target (i.e., 3D mesh). This matrix of weights can then be used, at 1160, to map values from the source data space (e.g., values of physical characteristics associated with mesh nodes, or centroids or integration points of the mesh elements or the faces or edges thereof) to the target data space.

Figure 12:
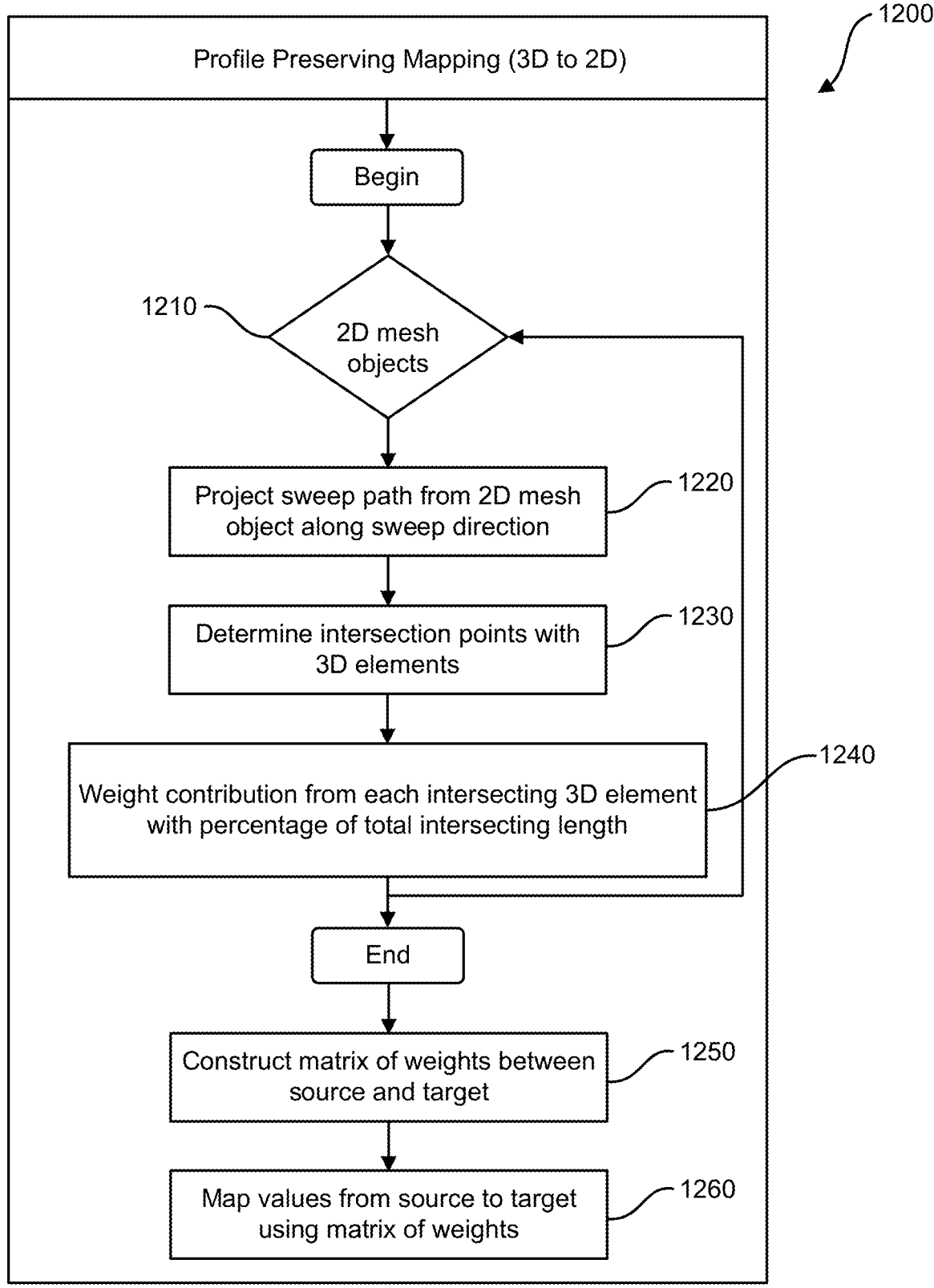
FIG. 12 is a process flow diagram illustrating the transfer of profile preserving data from a 3D space to a 2D space.

FIG. 12 is a process flow diagram 1200 showing further details regarding the scenario for the transfer of profile preserving data from a 3D space (having a corresponding 3D mesh) to a 2D space (having a corresponding 2D mesh). The process begins, at 1210, by identifying mesh objects (e.g., nodes, elements centroids, quadrature points, etc.) within the 2D mesh. An iterative process then begins, at 1220, in which a sweep path (e.g., a curve, etc.) is projected along a sweep direction from a mesh object in the 2D mesh. Thereafter, at 1230, an intersection of the sweep path and 3D elements on the 3D mesh is determined. Next, at 1240, a contribution from each intersecting 3D element is weighted based on its percentage of total intersecting length. The process can continue until all mesh objects on the 2D mesh are characterized. The output can be, at 1250, a matrix of weights between the source (i.e., 3D mesh) and the target (i.e., 2D mesh). This matrix of weights can then be used, at 1260, to map values from the source data space (e.g., values of physical characteristics associated with mesh nodes, or centroids or integration points of the mesh elements or the faces or edges thereof) to the target data space.

Figure 13:
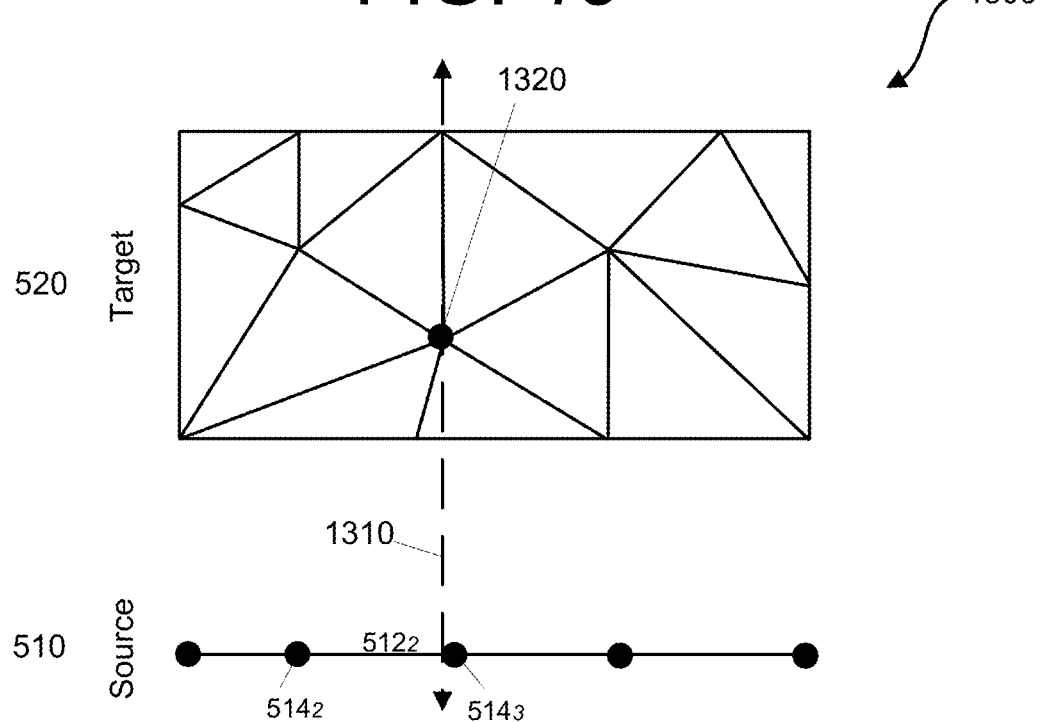

FIGS. 13-15 are diagrams 1300-1500 illustrating aspects of the process of FIG. 11 relating to the transfer of profile preserving data from a 2D space to a 3D space. For purposes of illustration, the 3D mesh object being used for these examples are nodes of the 3D mesh. Initially, with reference to FIG. 13, the source 510 comprises a series of 2D elements 512 (e.g., triangles) which together form the 2D mesh 510. In addition, the target comprises a series of 3D elements 522 (e.g., tetrahedra) which together form the 3D mesh 520. A sweep path 1310 is projected from a node 1320 of the 3D mesh 520 in a sweep direction relative to the 2D mesh 510 which intersects the 2D mesh 510 at 2D element $512_2$. With reference to FIG. 14, an intersection 1330 between the 2D mesh 510 and the sweep path 1310 is determined. FIG. 15 illustrates the advancement of the iterative process of FIG. 11 with the construction of a new sweep path 1340 extending from node 1350 and intersecting 2D element $512_3$.

With the examples of FIGS. 13-15, the projected intersection point with the source domain can be used to determine contribution of the source domain on the target node as follows:

$$\phi_{tj} = f(\phi_s, I_{tj})$$

where $\phi_{tj}$ is the target data on the jth node (e.g., node 1320), f can represent a linear combination of the source data, $\phi_s$ on the source domain 510, and the projected intersection point, $I_{tj}$ (e.g. 1330). For example, a sweep path 1310 is projected from a target node 1320. Source data associated with the nodes of the source domain, $514_1$ and $514_2$, are used in conjunction with shape functions for a 2D element on the source domain, $512_2$, to compute the value at the intersection point 1330 which is located within $512_2$. The target data of node 1320 can be determined based on a mapping of the value of intersection point 1330 of the source domain 510.

Figure 16:
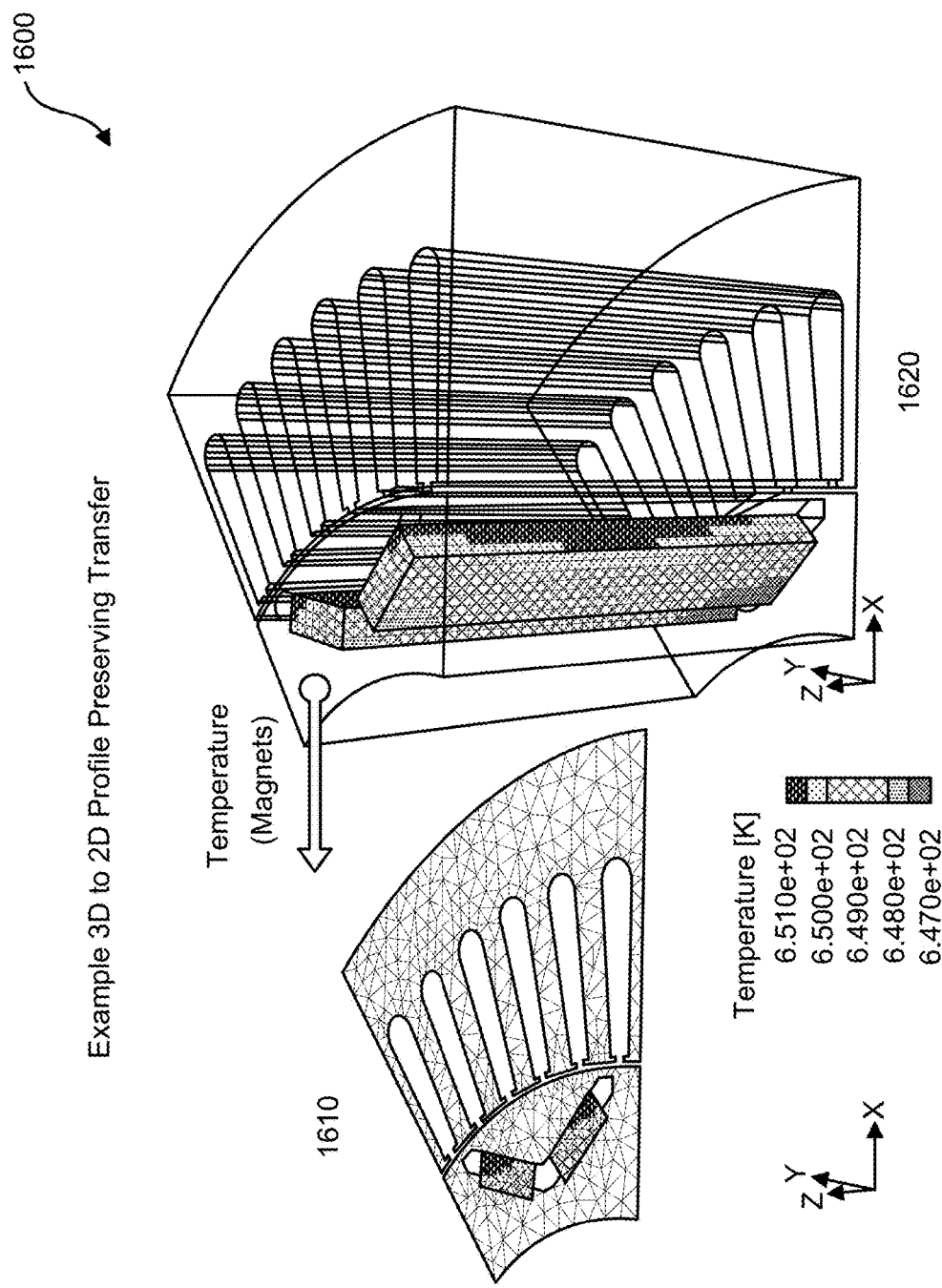
FIG. 16 is a diagram illustrating an example visualization generated from the transfer of profile preserving data from a 3D space to a 2D space as in FIG. 12.

FIG. 16 is a diagram 1600 illustrating transfer of profile preserving data from a 3D space to a 2D space. Thermal physics solver in 3D space 1620 calculates temperature in the magnets, which is applied using a profile preserving data transfer to the electromagnetics physics solver in 2D space 1610.

Figure 17:
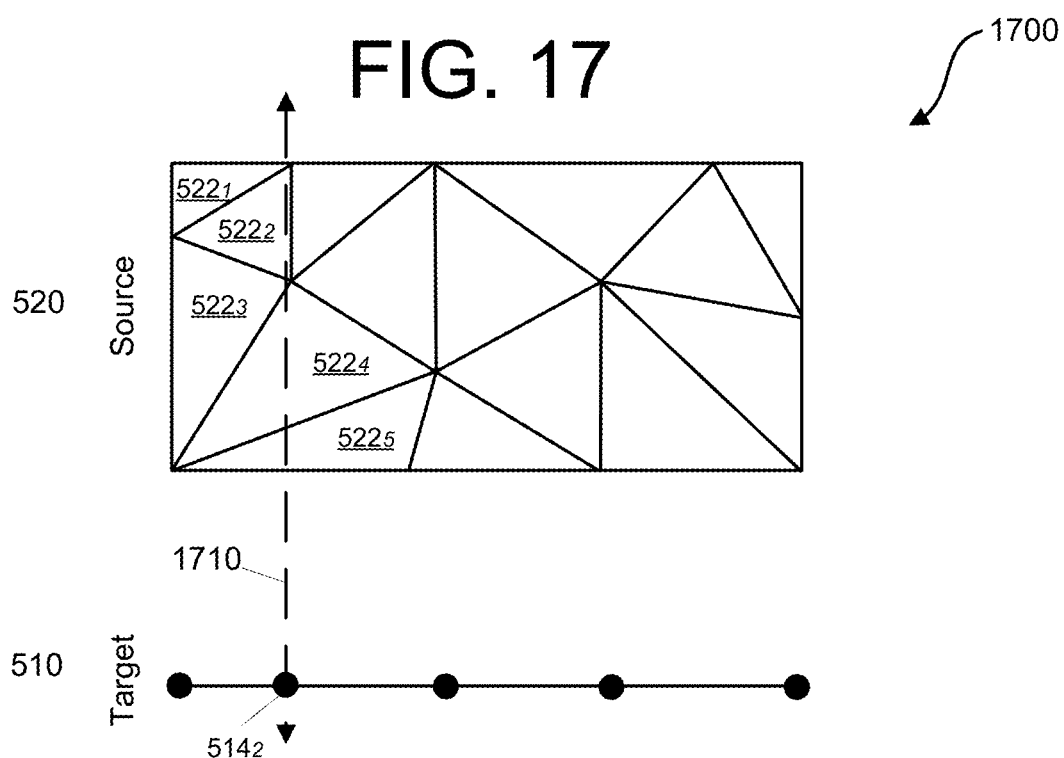
FIGS. 17-19 are diagrams illustrating aspects of the process of FIG. 12 relating to the transfer of profile preserving data from a 3D space to a 2D space.
Figure 18:
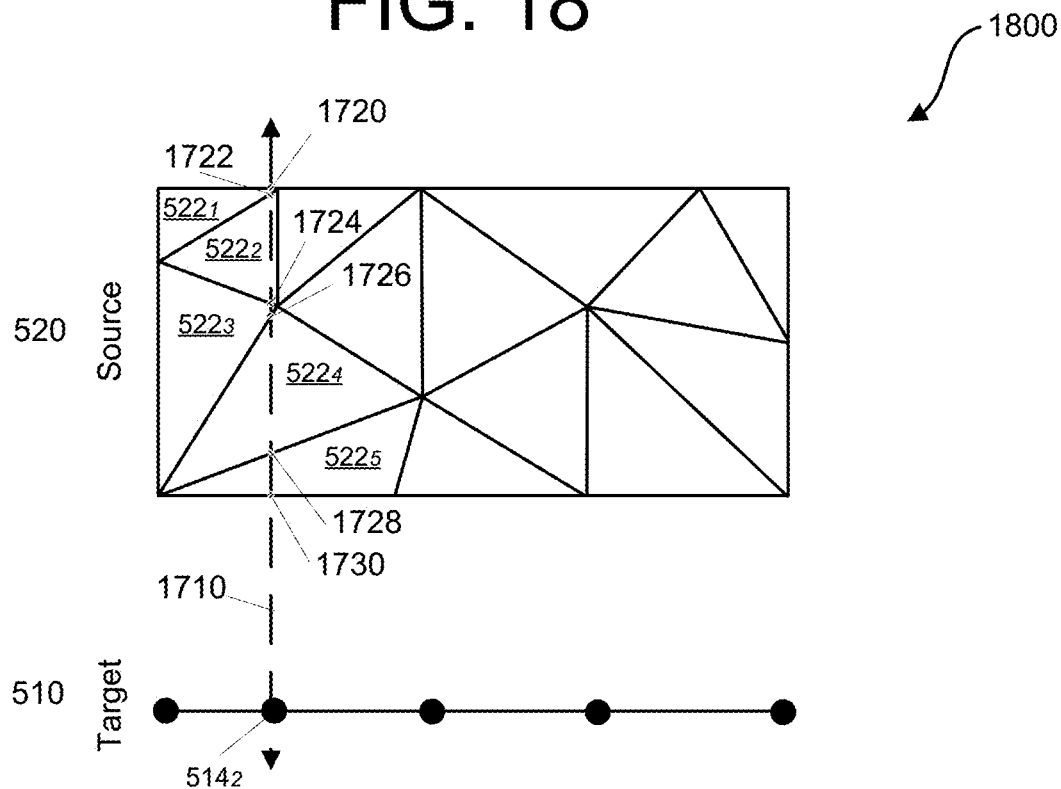
Figure 19:
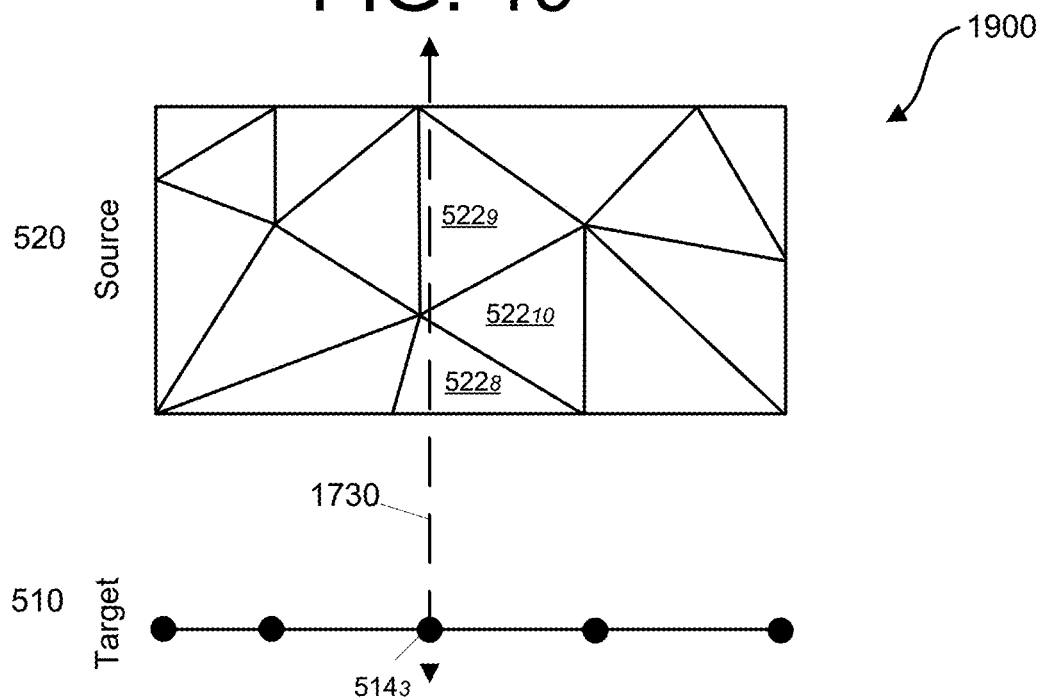

FIGS. 17-19 are diagrams 1700-1900 illustrating aspects of the process of FIG. 12 relating to the transfer of profile preserving data from a 3D space to a 2D space. For purposes of illustration, the 2D mesh object being used for these examples are nodes of the 2D mesh. Initially, with reference to FIG. 17, the source 520 comprises a series of 3D elements $522_{1...n}$ (e.g., tetrahedra) which together form the 3D mesh 520. In addition, the target 510 comprises a series of 2D elements $512_{1...n}$ (e.g., triangles) which together form the 2D mesh 510. A sweep path 1710 is projected from a node $514_2$ of the 2D mesh 510 in a sweep direction. As is illustrated, the sweep path 1710 extends and intersects the 3D mesh 520 and several 3D elements $522_{1...5}$. With reference to FIG. 18, an intersection from 1720 to 1730 between the sweep path 1710 and the 3D mesh 520 is determined (e.g., a total length of intersection). The length of intersections with the sweep path 1710 and the 3D elements $522_{1...5}$ are used to calculate a weight for each contribution (e.g., lengths between 1720-1722; 1722-1724; 1724-1726, 1726-1728, 1728-1730). FIG. 19 illustrates the advancement of the iterative process of FIG. 12 with the construction of a new sweep path 1730 extending from node $514_3$.

With the examples of FIGS. 17-19, the contribution from elements (e.g., 3D elements $522_{1...5}$) in the source domain 520 are dependent on the intersection of the source domain 520 with the projected sweep path from the target mesh object as follows:

$$\phi_{tj} = f(\phi_s, V_s \cap P_t)$$

where $O_{tj}$ is the target data on the jth element $512_j$, f can represent a linear combination of source data, $\phi_s$ values associated with intersected source elements of source domain 520, and $V_s \cap P_t$ is the intersected length between the source domain 520 and the sweep path $P_t$ from the target point $514_2$. For example, a sweep path from a node, $514_2$, on the target domain, 510, intersects with elements $522_1$, $522_2$, $522_3$, $522_4$, and $522_5$ on the source domain 520. Intersection on the faces of the source elements occur at 1720, 1722, 1724, 1726, 1728, and 1730 which yield intersection lengths 1720-1722, 1722-1724, 1724-1726, 1726-1728, and 1728-1730 for source elements $522_1$, $522_2$, $522_3$, $522_4$, and $522_5$, respectively. The value on each source element is found by, for example, computing the average value over the length of the intersection between the sweep path 1710 and the source element. The values for each source element ($522_1$ to $522_5$) are weighted by the length of the intersection between source element and the sweep path divided by the total length of the intersection of the source domain 520 and the sweep path. The target value may then be found by summing the multiplication of the value and weight of each source element.

Figure 20:
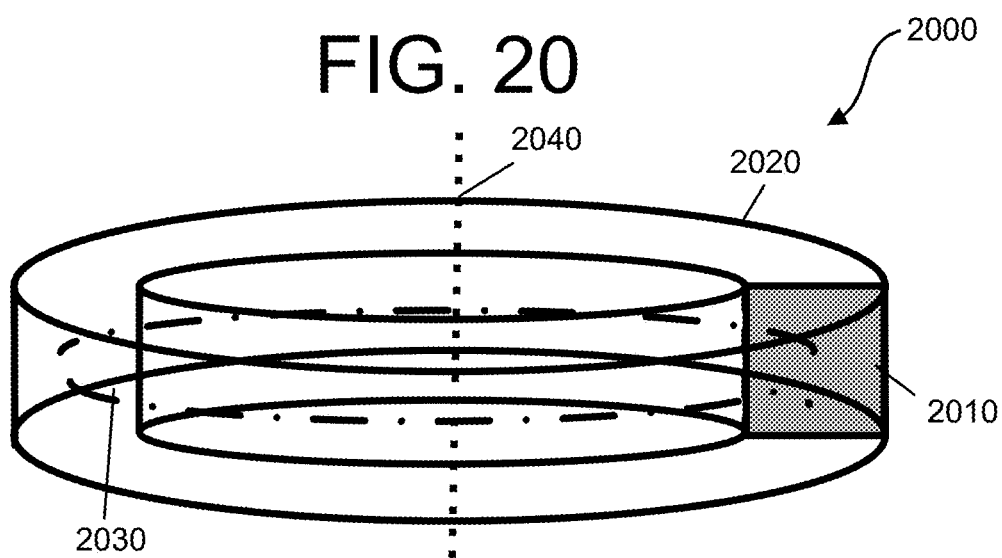
FIG. 20 is a diagram illustrating a rotational sweep path.
Figure 21:
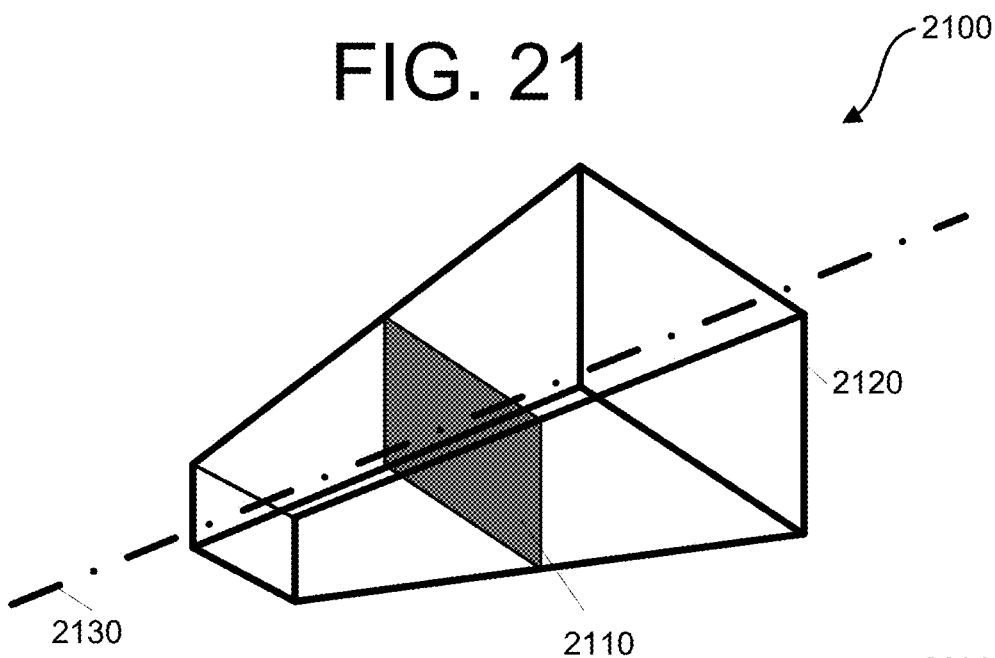
FIG. 21 is a diagram illustrating a linear sweep path with scaling.
Figure 22:
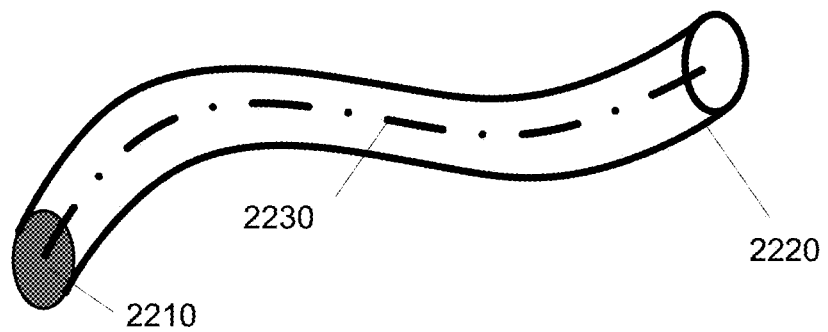
FIG. 22 is a diagram illustrating an arbitrary sweep path.

In addition to the sweep direction being in a normal direction, it can take other paths. For example, with reference to diagram 2000 of FIG. 20 which illustrates the relationship between a 2D simulation model 2010 and a 3D simulation model 2020, the sweep direction 2030 is rotational around a center axis 2040. With reference to diagram 2100 of FIG. 21 which illustrates the relationship between a 2D simulation model 2110 and a 3D simulation model 2120, the sweep direction 2130 is linear and includes scaling of the cross-section over the path. With reference diagram 2200 of FIG. 22 which illustrates the relationship between a 2D simulation model 2210 and a 3D simulation model 2220, the sweep direction 2230 can go along an arbitrary path.

Figure 23:
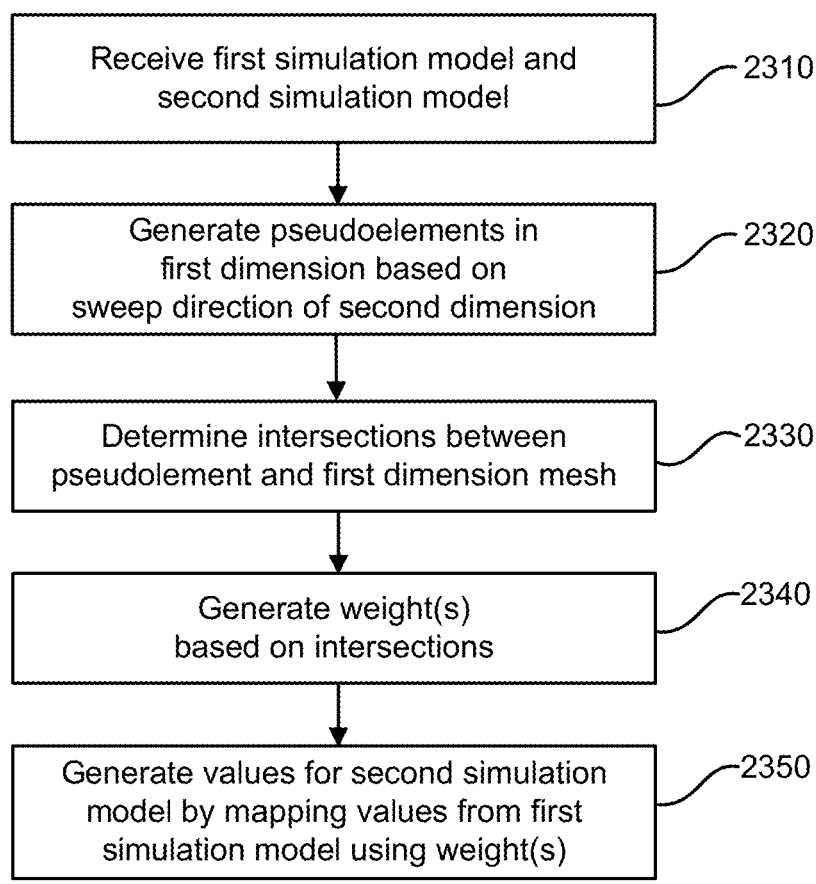
FIG. 23 is a process flow diagram illustrating the transfer of conservative data from a source simulation model to a target simulation model.

FIG. 23 is a process flow diagram 2300 illustrating data transfer between simulation models having different topological dimensionality including a first dimension and a second dimension in which, at 2310, data is received (e.g., accessed, loaded, etc.) that characterizes a first simulation model for a physical object having a first mesh and a second simulation model for the physical object having a second mesh The first simulation model has a different dimensionality that the second simulation model. The first dimension and the second dimension may refer to two different dimensions for simulation models. In one embodiment, the first dimension (e.g. 3D or 2D) may be higher than the second dimension (e.g. 2D or 1D).

A pseudoelement is then generated, at 2320, in the first dimension based on a sweep direction of the second dimension. Next, at 2330, an intersection between the pseudoelement and the mesh of the first dimension is determined. Based on the determined intersection, at 2340, one or more weights is then generated. Values of physical characteristics for the second simulation model are generated, at 2350, by mapping values of the physical characteristics from the first simulation model using the one or more weights. Such values are, for example, numerical values characterizing force, mass, or thermal energy. In one embodiment, the first simulation model may be of the first dimension and the second simulation model may be of the second dimension. In other embodiments, the first simulation model may by of the second dimension and the first simulation model may be of the first dimension.

Figure 24:
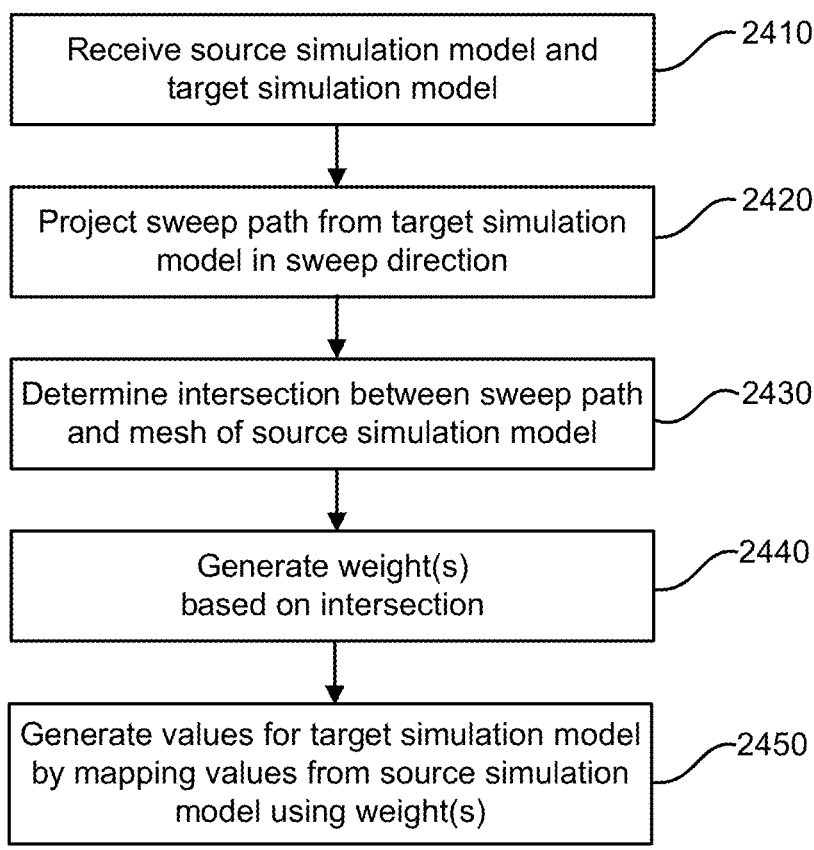
FIG. 24 is a process flow diagram illustrating the transfer of profile preserving data from a source simulation model to a target simulation model.

FIG. 24 is a process flow diagram 2400 illustrating data transfer between simulation models having different topological dimensionality in which, at 2410, data is received (e.g., accessed, loaded, etc.) that characterizes a source simulation model of a physical object and a target simulation model of the physical object. The source simulation model includes a first mesh. The target simulation model has a different dimensionality than the first simulation model and includes a second mesh having a plurality of second mesh elements. A sweep path is projected from the target simulation model, at 2420 in a sweep direction. Subsequently, at 2430, an intersection between the sweep path and the first mesh is determined. Based on this intersection, at 2440, one or more weights is generated. Values of characteristics for the target simulation model are then generated, at 2450, by mapping values of the physical characteristics from the first mesh to the second mesh using the one or more weights. Such values are, for example, numerical values characterizing temperature, convection coefficients, and/or mesh displacements.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any non-transitory computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computing device having a display device (e.g., a CRT (cathode ray tube) or LCD (liquid crystal display) monitor) for displaying information obtained from a bus via a display interface to the user and an input device such as keyboard and/or a pointing device (e.g., a mouse or a trackball) and/or a touchscreen by which the user can provide input to the computer. Other kinds of input devices can be used to provide for interaction with a user as well; for example, feedback provided to the user can be any form of sensory feedback (e.g., visual feedback, auditory feedback by way of a microphone, or tactile feedback); and input from the user can be received in any form, including acoustic, speech, or tactile input. The input device and the microphone can be coupled to and convey information via the bus by way of an input device interface. Other computing devices, such as dedicated servers, can omit one or more of the display and display interface, the input device, the microphone, and input device interface.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method for transferring data between simulation models having different topological dimensionality including a first dimension and a second dimension, the method comprising:
    receiving data characterizing a first simulation model of a physical object and a second simulation model of the physical object, the first simulation model comprising a first mesh, the second simulation comprising a second mesh, the first simulation model having a different dimensionality than the second simulation model;
    generating a pseudoelement in the first dimension based on a sweep direction of a mesh of the second dimension, wherein the first dimension is higher than the second dimension;
    determining an intersection between the pseudoelement and a mesh of the second dimension;
    generating one or more weights based on the determined intersection; and
    generating values of physical characteristics for the second simulation model by mapping values of the physical characteristics from the first simulation model using the one or more weights.

2. The method of claim 1, wherein the first simulation model includes the mesh of the second dimension and the second simulation includes the mesh of the first dimension, wherein the mesh of the second dimension corresponds to a 2D mesh and wherein the mesh of the first dimension corresponds to a 3D mesh.

3. The method of claim 1, wherein the first simulation model includes the mesh of the first dimension and the second simulation model includes the mesh of the second dimension, wherein the mesh of the second dimension corresponds to a 2D mesh and wherein the mesh of the first dimension corresponds to a 3D mesh.

4. The method of claim 1, wherein the generated values of the physical characteristics for the second simulation model characterize: force, mass, or thermal energy.

5. The method of claim 1, wherein the mesh of the second dimension includes a 2D element, and wherein the pseudo-element is generated according to the 2D element swept along the sweep direction.

6. The method of claim 1, wherein the sweep direction comprises: a normal direction, a rotational direction, a path which includes scaling of the mesh of the second dimension, or an arbitrary path.

7. The method of claim 2, wherein the first simulation model includes the 2D mesh, wherein the second simulation model includes the 3D mesh having a 3D element, wherein the intersection has a total intersected volume, wherein the 3D element and the pseudoelement intersect with an intersection volume, the method further comprising:
    calculating contributions from the 2D element to the 3D element based on a percentage of the intersection volume compared to the total intersected volume;
    wherein the weights are generated based on the percentage.

8. The method of claim 3, wherein the first simulation model includes the 3D mesh have a 3D element, wherein the second simulation model includes the 2D mesh, wherein the intersection has a total intersected volume, wherein the 3D element and the pseudoelement intersect with an intersection volume, the method further comprising:
    calculating a contribution from the 3D element to the 2D element based on a percentage of the intersection volume compared to the total intersected volume
    wherein the weights are generated based on the percentage.

9. The method of claim 1 further comprising:
    causing the generated values to be displayed in an electronic visual display, persisting the generated values in physical storage, loading the generated values into memory, or transmitting the generated values to a remote computing system.

10. A computer-implemented method for transferring data between simulation models having different topological dimensionality comprising:
    receiving data characterizing a source simulation model of a physical object and a target simulation model of the physical object, the source simulation model comprising a first mesh and a mesh object having a plurality of mesh elements, the target simulation model having a different dimensionality than the first simulation model and comprising a second mesh;
    projecting a sweep path from the mesh object of the target simulation model in a sweep direction;

determining intersections between the sweep path and the first mesh in the source simulation model calculating, for each mesh element of the source simulation model, a contribution from the mesh element in the corresponding intersection;

generating one or more weights based on the calculated contributions; and generating values of physical characteristics for the target simulation model by mapping values of the physical characteristics from the first mesh to the second mesh using the one or more weights.

11. The method of claim 10, wherein the source simulation model is a two dimensional (2D) simulation model and the target simulation model is a three dimensional (3D) simulation model.

12. The method of claim 10, wherein the source simulation model is a three dimensional (3D) simulation model and the target simulation model is a two dimensional (2D) simulation model.

13. The method of claim 10, wherein the generated values of the physical characteristics for the target simulation model characterize: temperature, convection coefficients, or mesh displacements.

14. The method of claim 10, wherein the target simulation model comprises a mesh object and the sweep path is projected from the mesh object.

15. The method of claim 14, wherein the mesh object comprise nodes, elements centroids, or quadrature points.

16. The method of claim 10, wherein the sweep path is a curve.

17. The method of claim 10, wherein the sweep direction comprises: a normal direction, a rotational direction, a path which includes scaling of a 2D mesh, or an arbitrary path.

18. The method of claim 14, wherein the calculating of the contributions from each mesh element uses a shape function.

19. The method of claim 12, wherein the calculated contribution from each mesh element is based on a percentage that the mesh element intersects a corresponding intersection.

20. Non-transitory computer readable media comprising instructions which, when executed by at least one computing device, result in operations for transferring data between simulation models having different topological dimensionality including a first dimension and a second dimension, the operations comprising:

receiving data characterizing a first simulation model of a physical object and a second simulation model of the physical object, the first simulation model comprising a first mesh, the second simulation comprising a second mesh, the first simulation model having a different dimensionality than the second simulation model;

generating a pseudoelement in the first dimension based on a sweep direction of a mesh of the second dimension, wherein the first dimension is higher than the second dimension;

determining an intersection between the pseudoelement and a mesh of the first dimension;

generating one or more weights based on the determined intersection; and generating values of physical characteristics for the second simulation model by mapping values of the physical characteristics from the first simulation model using the one or more weights.

* * * * *